United States Patent [19]
Al-Shareef et al.

[11] Patent Number: 6,162,744
[45] Date of Patent: *Dec. 19, 2000

[54] METHOD OF FORMING CAPACITORS HAVING HIGH-K OXYGEN CONTAINING CAPACITOR DIELECTRIC LAYERS, METHOD OF PROCESSING HIGH-K OXYGEN CONTAINING DIELECTRIC LAYERS, METHOD OF FORMING A DRAM CELL HAVING HAVING HIGH-K OXYGEN CONTAINING CAPACITOR DIELECTRIC LAYERS

[75] Inventors: Husam N. Al-Shareef; Scott Jeffrey DeBoer, both of Boise, Id.; Randhir P. S. Thakur, San Jose, Calif.

[73] Assignee: Micron Technology, Inc., Boise, Id.

[*] Notice: This patent issued on a continued prosecution application filed under 37 CFR 1.53(d), and is subject to the twenty year patent term provisions of 35 U.S.C. 154(a)(2).

[21] Appl. No.: 09/033,064

[22] Filed: Feb. 28, 1998

[51] Int. Cl.$^7$ .......................... H01L 21/31; H01L 21/469; H01L 21/20

[52] U.S. Cl. ............................. 438/785; 438/3; 438/240; 438/396

[58] Field of Search .................................. 438/396, 393, 438/386, 778, 780, 781, 785, 3, 240

[56] References Cited

U.S. PATENT DOCUMENTS

| | | |
|---|---|---|
| 4,333,808 | 6/1982 | Bhattacharyya et al. . |
| 4,464,701 | 8/1984 | Roberts et al. .......................... 361/313 |
| 4,891,682 | 1/1990 | Yusa et al. ............................... 357/30 |
| 4,952,904 | 8/1990 | Johnson et al. ........................... 338/36 |
| 5,053,917 | 10/1991 | Miyasaka et al. ....................... 361/321 |
| 5,079,191 | 1/1992 | Shinriki et al. ......................... 437/235 |
| 5,142,438 | 8/1992 | Reinberg et al. ....................... 361/313 |
| 5,191,510 | 3/1993 | Huffman ................................. 361/313 |
| 5,234,556 | 8/1993 | Oishi et al. ......................... 204/157.51 |
| 5,279,985 | 1/1994 | Kamiyama ............................... 437/60 |
| 5,293,510 | 3/1994 | Takenaka ............................... 257/295 |
| 5,316,982 | 5/1994 | Taniguchi .............................. 437/236 |
| 5,330,935 | 7/1994 | Dobuzinsky et al. .................. 437/239 |
| 5,335,138 | 8/1994 | Sandhu et al. ......................... 361/303 |
| 5,348,894 | 9/1994 | Gnade et al. ............................. 437/12 |
| 5,352,623 | 10/1994 | Kamiyama ............................... 437/52 |
| 5,362,632 | 11/1994 | Mathews ................................. 437/47 |
| 5,372,859 | 12/1994 | Thakoor ................................ 427/551 |
| 5,397,446 | 3/1995 | Ishihara et al. . |
| 5,438,012 | 8/1995 | Kamiyama . |
| 5,442,213 | 8/1995 | Okudaira et al. ...................... 257/310 |
| 5,466,629 | 11/1995 | Mihara et al. ........................... 437/60 |
| 5,468,687 | 11/1995 | Carl et al. ............................. 437/235 |
| 5,471,364 | 11/1995 | Summerfelt et al. ................ 361/321.4 |
| 5,504,041 | 4/1996 | Summerfelt ........................... 437/235 |
| 5,508,953 | 4/1996 | Fukuda et al. ......................... 365/145 |
| 5,510,651 | 4/1996 | Maniar et al. .......................... 257/751 |
| 5,552,337 | 9/1996 | Kwon et al. ............................. 437/60 |
| 5,555,486 | 9/1996 | Kingon et al. ......................... 361/305 |
| 5,561,307 | 10/1996 | Mihara et al. ......................... 257/295 |
| 5,585,300 | 12/1996 | Summerfelt . |
| 5,617,290 | 4/1997 | Kulwicki et al. . |
| 5,641,702 | 6/1997 | Imai et al. . |
| 5,654,222 | 8/1997 | Sandhu et al. ............................. 438/3 |

(List continued on next page.)

FOREIGN PATENT DOCUMENTS

| | | |
|---|---|---|
| 5-221644 | 8/1993 | Japan . |
| 405343641 | 12/1993 | Japan . |
| 6-021333 | 1/1994 | Japan . |

OTHER PUBLICATIONS

U.S. application No. 09/059,057, filed Apr. 1998, Agarwal et al.

U.S. application No. 09/033,063, filed Feb. 1998, Al–Shareef et al.

U.S. application No. 09/058,612, filed Apr. 1998, Agarwal et al.

U.S. application No. 09/083,257, filed May 1998, Al–Shareef et al.

U.S. application No. 09/137,780, filed Aug. 1998, Al–Shareef et al.

U.S. application No. 09/074,638, filed May 1998, Agarwal et al.

U.S. application No. 08/858,027, filed May 1997, Sandhu et al.

U.S. application No. 08/738,789, filed Oct. 1996, Sandhu et al.

U.S. application No. 08/881,561, filed Jun. 1997, Sandhu et al.

U.S. application No. 09/086,389, filed May 1998, Sandhu et al.

(List continued on next page.)

*Primary Examiner*—Charles Bowers
*Assistant Examiner*—Evan Pert
*Attorney, Agent, or Firm*—Wells, St. John, Roberts, Gregory & Matkin, P.S.

[57] ABSTRACT

In a capacitor forming method, a first capacitor electrode is formed over a substrate. A high K oxygen containing capacitor dielectric layer is formed over the first capacitor electrode. A first annealing of the high K capacitor dielectric layer is conducted at a temperature of at least about 500° C. in a substantially non-oxidizing atmosphere. After the first annealing, second annealing the high K capacitor dielectric layer occurs at a temperature of less than or equal to about 500° C. in an oxidizing atmosphere. A second capacitor electrode is formed over the high K oxygen containing capacitor dielectric layer, preferably after the second annealing. In another considered implementation, the capacitor dielectric layer is annealed in multiple steps including at least two different temperatures. A second capacitor electrode is formed over the high K oxygen containing dielectric layer, with the substrate not being exposed to a gaseous oxygen containing atmosphere at a temperature of greater than about 500° C. between the capacitor dielectric layer formation and formation of the second capacitor electrode. The invention also contemplates dielectric layer processing apart from capacitor formation, and the fabrication of DRAM circuitry.

41 Claims, 3 Drawing Sheets

U.S. PATENT DOCUMENTS

| | | | |
|---|---|---|---|
| 5,663,088 | 9/1997 | Sandhu et al. | 438/396 |
| 5,688,724 | 11/1997 | Yoo et al. | 437/235 |
| 5,728,603 | 3/1998 | Emesh et al. | |
| 5,738,789 | 10/1996 | Sandhu et al. | |
| 5,780,359 | 7/1998 | Brown et al. | |
| 5,786,248 | 7/1998 | Schuegraf | 438/240 |
| 5,790,366 | 8/1998 | Desu et al. | 361/305 |
| 5,798,903 | 8/1998 | Dhote et al. | 361/321.4 |
| 5,807,774 | 9/1998 | Desu et al. | |
| 5,814,852 | 9/1998 | Sandhu et al. | 257/310 |
| 5,834,345 | 11/1998 | Shimizu. | |
| 5,837,591 | 11/1998 | Shimada et al. | |
| 5,837,593 | 11/1998 | Park et al. | |
| 5,838,035 | 11/1998 | Ramesh. | |
| 5,843,830 | 12/1998 | Graettinger et al. | 438/396 |
| 5,844,771 | 12/1998 | Graettinger et al. | 361/303 |
| 5,888,295 | 3/1999 | Sandhu et al. | |
| 5,899,740 | 5/1999 | Kwon. | |
| 5,910,218 | 6/1999 | Park et al. | 118/719 |
| 5,910,880 | 6/1999 | DeBoer et al. | 361/311 |
| 5,930,584 | 7/1999 | Sun et al. | 438/3 |
| 5,933,316 | 8/1999 | Ramakrishnan et al. | 361/311 |
| 5,970,369 | 10/1999 | Hara et al. | |
| 5,990,507 | 11/1999 | Mochizuki et al. | |
| 6,010,744 | 1/2000 | Buskirk et al. | |
| 6,015,989 | 1/2000 | Horikawa et al. | |
| 6,027,969 | 2/2000 | Huang et al. | |
| 6,028,360 | 2/2000 | Nakamura et al. | |
| 6,046,469 | 4/2000 | Yamazaki et al. | |
| 6,051,859 | 4/2000 | Hosotani et al. | |
| 6,071,771 | 6/2000 | Schuegraf. | |
| 8,542,430 | 10/1995 | Schuegraf. | |
| 8,670,644 | 6/1996 | Graettinger. | |
| 8,858,027 | 5/1997 | Sandhu et al. | |
| 8,994,054 | 12/1997 | Parekh et al. | |
| 9,033,063 | 2/1997 | Al-Shareef et al. | |
| 9,098,035 | 6/1998 | DeBoer et al. | |
| 9,185,412 | 11/1998 | Graettinger et al. | |

OTHER PUBLICATIONS

U.S. application No. 09/122,473, filed Jul. 1998, Schuegraf.
U.S. application No. 09/098,035, filed Jun. 1998, DeBoer et al.
U.S. application No. 09/185,412, filed Nov. 1998, Graettinger et al.
U.S. application No. 08/994,054, filed Dec. 1997, Kunal Parekh et al.

Anonymous Research Disclosure, 1989RD–0299041 titled "Double High Dielectric Capacitor", Derewent–Week 198917 (Derwent World Patent Index), Feb. 20, 1989.

McIntyre, Paul C. et al., "Kinetics And Mechanisms Of TiN Oxidation Beneath Pt/TiN Films", *J. Appl. Phys.*, vol. 82, No. 9, pp. 4577–4585 (Nov. 1997).

Eimori, T., et al. "Newly Designed Planar Stacked Capacitor Cell with High Dielectric Constant Film for 256Mbit DRAM" *I.E.E.E.*, IEDM 93–631–4, pp. 631–634 (1993).

Fazan, P.C., et al., "A High–C Capacitor (20.4 fF/$\mu$m$^2$) with Ultrathin CVD—$Ta_2O_5$ Films Deposited On Rugged Poly–Si For High Density DRAMs", *I.E.E.E.*, IEDM 92–263, pp. 264–266 (1992).

Yamaguchi, Hiromu, et al., "Structural and Electrical Characterization of $SrTiO_3$ Thin Films Prepared by Metal Organic Chemical Vapor Deposition", *Jpn. J. Appl. Phys.*, vol. 32, Pt. 1, No. 9B, pp. 4069–4073 (1993).

Kamiyama, Satoshi, et al. "Ultrathin Tanalum Oxide Capacitor Dielectric Layers Fabricated Using Rapid Thermal Nitridation Prior to Low Pressure Chemical Vapor Deposition", *J. Electrochem. Soc.*, vol. 140, # 6, p. 1619–25 (1993).

Lesiacherre, P–Y, et al., "A Gbit scale DRAM stacked capacitor Technology with ECR MOCVD $SrTiO_3$ and RIE Patterned $RuO_2$/TiN storage nodes", *I.E.E.E.*, IEDM 94–832, pp. 831–834 (1994).

Onishi, Shigeo, et al., "A Half–Micron Ferroelectric Memory Cell Technology With Stacked Capacitor Structure" *I.E.E.E.*, IDEM 94–843, pp. 843–846, (1994).

Kamiyama, Satoshi, et al. "Highly Reliable 2.5nm $Ta_2O_5$ Capacitor Process Technology for 256Mbit DRAMs" *I.E.E.E.*, IDEM 91–827, pp. 827–830 (1991).

Hiroshi Shinriki et al., *$UV–O_3$ and Dry–$O_2$: Two–Step Annealed Chemical Vapor–Deposited $Ta_2O_5$ Films for Storage Dielectrics of 64–Mb DRAM's*, IEEE Transactions On Electron Devices, No. 3, pp. 453–462 (Mar. 1991).

S. Wolf and R.N. Tauber, *Silicon Processing for the VLSI Era.* vol. 2, Lattice Press, pp. 589–591.

M.A. Farooq. S.P. Murarka. C.C. Chang. F.A. Baiocchi. *Tantalum nitride as a dissusion barrier between $Pd_2Si$. CoSi2 and aluminum.* 1989 American Institute of Physics, pp. 3017–3022.

H. Shinriki and M. Nakata, IEEE Transaction On Electron Devices, vol. 38 No. 3, Mar. 1991.

METHOD OF FORMING CAPACITORS HAVING HIGH-K OXYGEN CONTAINING CAPACITOR DIELECTRIC LAYERS, METHOD OF PROCESSING HIGH-K OXYGEN CONTAINING DIELECTRIC LAYERS, METHOD OF FORMING A DRAM CELL HAVING HAVING HIGH-K OXYGEN CONTAINING CAPACITOR DIELECTRIC LAYERS

TECHNICAL FIELD

This invention relates to methods of forming capacitors, to methods of processing dielectric layers, and to methods of forming DRAM cells.

BACKGROUND OF THE INVENTION

As DRAMs increase in memory cell density, there is a continuing challenge to maintain sufficiently high storage capacitance despite decreasing cell area. Additionally, there is a continuing goal to further decrease cell area. One principal way of increasing cell capacitance is through cell structure techniques. Such techniques include three-dimensional cell capacitors, such as trenched or stacked capacitors. Yet as feature size continues to become smaller and smaller, development of improved materials for cell dielectrics as well as the cell structure are important. The feature size of 256 Mb DRAMs will be on the order of 0.25 micron, and conventional dielectrics such as $SiO_2$ and $Si_3N_4$ might not be suitable because of small dielectric constants.

Highly integrated memory devices, such as 256 Mbit DRAMs, are expected to require a very thin dielectric film for the 3-dimensional capacitor of cylindrically stacked or trench structures. To meet this requirement, the capacitor dielectric film thickness will be below 2.5 nm of $SiO_2$ equivalent thickness.

Insulating inorganic metal oxide materials, such as ferroelectric materials or perovskite material or pentoxides such as tantalum pentoxide, have high dielectric constants and low leakage current which make them attractive as cell dielectric materials for high density DRAMs and non-volatile memories. Perovskite material and other ferroelectric materials exhibit a number of unique and interesting properties. One such property of a ferroelectric material is that it possesses a spontaneous polarization that can be reversed by an applied electric field. Specifically, these materials have a characteristic temperature, commonly referred to as the transition temperature, at which the material makes a structural phase change from a polar phase (ferroelectric) to a non-polar phase, typically called the paraelectric phase.

Despite the advantages of high dielectric constants and low leakage, insulating inorganic metal oxide materials suffer from many drawbacks. For example, all of these materials incorporate oxygen or are otherwise exposed to oxygen for densification to produce the desired capacitor dielectric layer. Unfortunately, the provision of such layers or subjecting such layers to oxidation densification also undesirably oxidizes the underlying bottom or lower storage node plate, which is typically conductively doped polysilicon. For example, $Ta_2O_5$ is typically subjected to an anneal in the presence of an oxygen ambient. The anneal drives any carbon present out of the layer and advantageously injects additional oxygen into the layer such that the layer uniformly approaches a stoichiometry of five oxygen atoms for every two tantalum atoms. The oxygen anneal is commonly conducted at a temperature of from about 400° C. to about 1000° C. utilizing one or more of $O_3$, $N_2O$ and $O_2$. The oxygen containing gas is typically flowed through a reactor at a rate of from about 0.5 slm to about 10 slm.

The art accepted solution to avoiding oxidation of underlying silicon is to provide an intervening oxidation barrier layer between the underlying conductive polysilicon and overlying insulating inorganic metal oxide dielectric layer. This layer is accordingly desirably electrically conductive, as the underlying polysilicon will be in electrical connection with the insulating inorganic metal oxide dielectric layer.

There are a limited number of oxidation barrier materials which are conductive. Elemental platinum (a conductive oxidation barrier) on polysilicon has been suggested as a composite layer or construction for a lower capacitor plate, but undergoes physical degradation with thermal cycling due to silicon diffusion through the platinum. Sputtered TiN and CVD TiN (other conductive barriers) have been known to fail due to diffusion along grain boundaries.

Further even with oxidation barriers, some oxidation of the underlying silicon can and does occur the more elevated the oxidation anneal temperature. High temperature anneals in non-oxidizing atmospheres have been used as a substitute for the oxygen anneal. Such have the advantage of achieving or repairing crystal structure without oxidizing the underlying silicon. However, the lack of oxygen prevents significant densification and homogenous production of the stoichiometric oxide. Thus, less than desirable dielectric constant will typically be achieved.

SUMMARY OF THE INVENTION

The invention includes methods of forming capacitors. In one implementation, a first capacitor electrode is formed over a substrate. A high K oxygen containing capacitor dielectric layer is formed over the first capacitor electrode. A first annealing of the high K capacitor dielectric layer is conducted at a temperature of at least about 500° C. in a substantially non-oxidizing atmosphere. After the first annealing, second annealing the high K capacitor dielectric layer occurs at a temperature of less than or equal to about 500° C. in an oxidizing atmosphere. A second capacitor electrode is formed over the high K oxygen containing capacitor dielectric layer, preferably after the second annealing.

In another considered implementation, the capacitor dielectric layer is annealed in multiple steps including at least two different temperatures. A second capacitor electrode is formed over the high K oxygen containing dielectric layer, with the substrate not being exposed to a gaseous oxygen containing atmosphere at a temperature of greater than about 500° C. between the capacitor dielectric layer formation and formation of the second capacitor electrode.

The invention also contemplates dielectric layer processing apart from capacitor formation, and the fabrication of DRAM circuitry.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
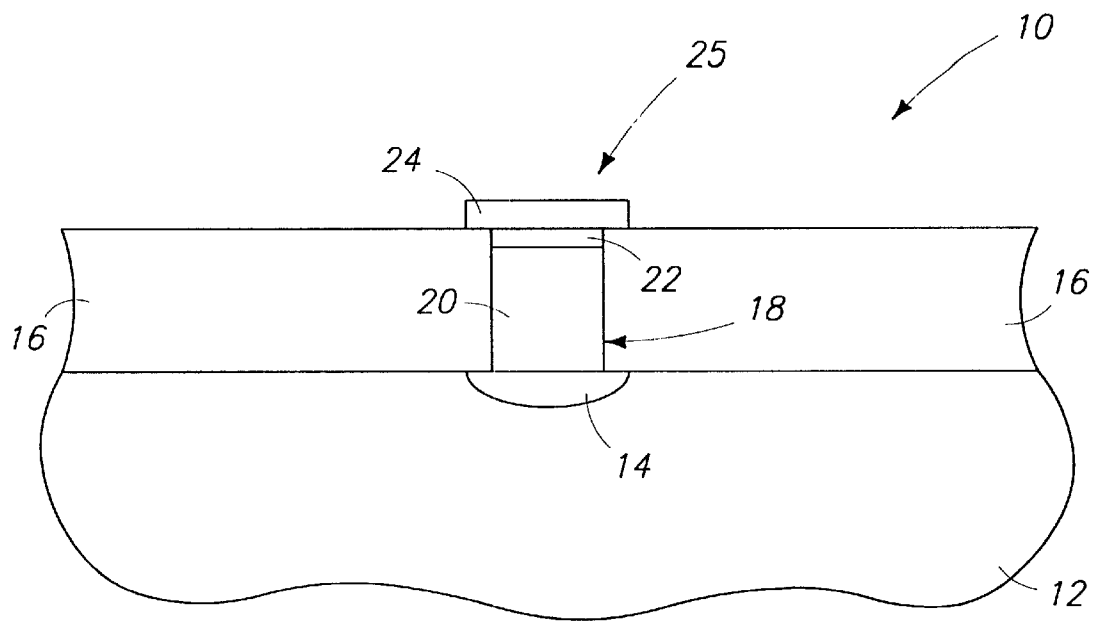
FIG. 1 is a diagrammatic view of a semiconductor wafer fragment at one processing step in accordance with the invention.

Referring to FIG. 1, a semiconductor wafer fragment or substrate is indicated generally with reference numeral 10. To aid in interpretation of the claims that follow, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Fragment 10 comprises a bulk monocrystalline silicon substrate 12 having a conductive diffusion region 14 formed therein. An insulating dielectric layer 16, such as borophosphosilicate glass, is formed over bulk wafer 12 and is provided to have a planar upper surface. A contact opening 18 is formed through insulating layer 16 to diffusion region 14. Conductive plugging materials 20 and 22 fill opening 18. An example and preferred composition for material 20 is conductively doped polysilicon. Such can be formed, for example, by chemical vapor deposition using $SiH_4$ as a precursor gas at a temperature of 535° C. and a pressure of 200 mTorr. The material of layer 22 is preferably chosen to function as a diffusion barrier layer to oxidation of the preferred silicon material 20. Example materials are ruthenium and titanium nitride. For example, TiN can be formed by chemical vapor deposition using an organic precursor. An example process utilizes precursors of $((CH_3)_2N)_4Ti$ at 150 sccm and $N_2$ at 80 sccm at a temperature of 420° C. and a pressure of 0.7 Torr.

The illustrated plugging construction can be produced by initially forming conductively doped polysilicon to completely fill opening 18. Such layer can then be etched back by wet or dry etches, or by chemical-mechanical polishing, to a point where all of conductive material 20 has been removed from over the upper surface of insulating layer 16, with the removal technique being continued to slightly recess material 20 within opening 18. Conductive material 22 is then deposited and planarized back, such as by chemical-mechanical polishing.

Another conductive layer 24, preferably ruthenium dioxide, is formed over layer 22 and is patterned to form a first capacitor electrode 25. An example process for chemical vapor depositing $RuO_x$ would be at a pressure of 1 Torr and a temperature of 175° C., with precursor feeds of Ru(tricarbonyl cyclohexdienyl) at 300 sccm and $O_2$ at 300 sccm. In preferred embodiments, the first capacitor electrode is configured to at least one of, a) contain silicon, or b) be formed proximately over silicon. As here described and intended to be shown, preferred capacitor electrode 25 is fabricated to be formed proximately over silicon material 20, with layer 22 serving as an intervening diffusion barrier layer which is conductive.

Figure 2:
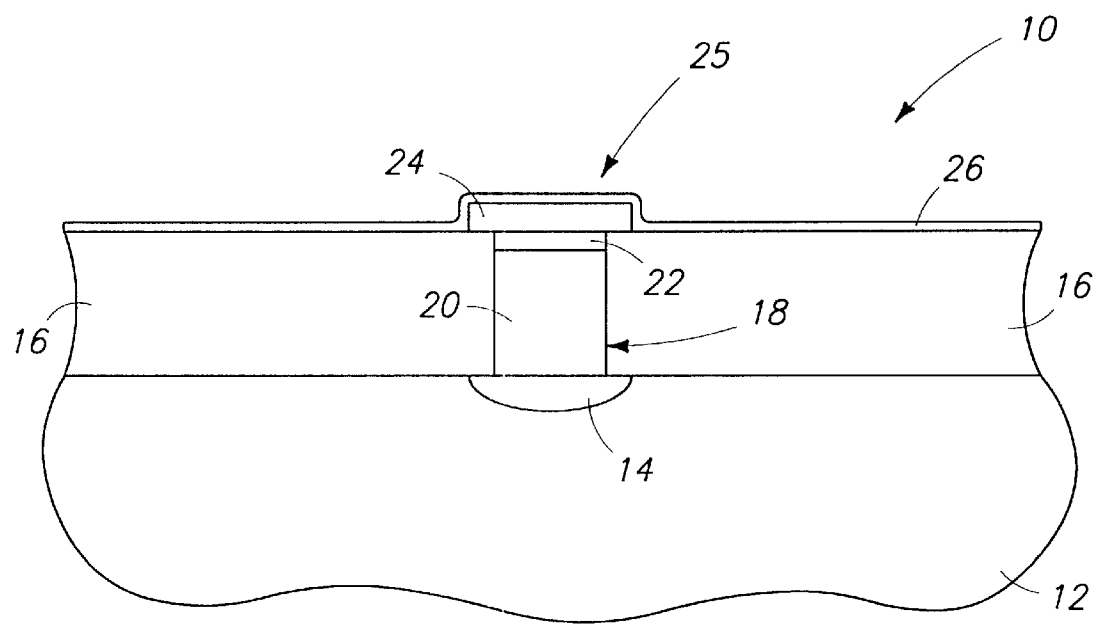
FIG. 2. is a view of the FIG. 1 wafer at a processing step subsequent to that depicted by FIG. 1.

Referring to FIG. 2, a high dielectric constant (K) oxygen-containing capacitor dielectric layer 26 is formed over first capacitor electrode 25. In the context of this document, "high K" defines any a dielectric constant of at least 20. Example and preferred materials for layer 26 are (Ba, Sr)$TiO_3$, $SrTiO_3$, (Pb, Zr)$TiO_3$, $Ta_2O_5$, and $Nb_2O_5$. As one example, a process for depositing (Ba, Sr)$TiO_3$ includes utilizing precursors of $Ba(DPM)_2$, $Sr(DPM)_2$ and $Ti(OC_3H_7)_4$, $O_2$ at 0.5 Torr and 410° C., where "DPM" denotes "dipivaloylmethanato". The oxide can be substantially amorphous or crystalline as formed depending in large part upon the processing temperature, with a substantially amorphous layer being formed from the above precursor gases at a temperature of 410° C. In the context of this document, "substantially amorphous" is meant to define a material which is at least 90% amorphous.

Substrate 10 and, accordingly, high K capacitor dielectric layer 26 are then subjected to a first annealing at a temperature of at least about 500° C. in a substantially non-oxidizing atmosphere. Elevated temperature of at least about 600° C. is preferred, with a preferred upper limit being 800° C. A preferred pressure range during the annealing is from 1 Torr to 1 atmosphere. A preferred atmosphere is one that is not only substantially non-oxidizing, but also one that is substantially inert to chemical reaction with the dielectric layer. Exemplary gaseous atmospheres include $N_2$ or Ar, achievable for example by feeding such gases at a rate anywhere from 1 to 5 slm. Most preferably, substrate 10 is not exposed to oxidizing conditions between formation of dielectric layer 26 and the first annealing step. By "substantially non-oxidizing", it is meant that the atmosphere is such that it does not provide appreciable oxygen insertion into or through layer 26. Such first annealing can fully crystallize or recrystallize the film into a desired perovskite crystal structure, or other structure, and anneal out a substantial concentration of defects and carbon containing material. Such annealing also can adversely create oxygen vacancies which are known to increase the leakage current of high K dielectric materials.

After the first annealing, the substrate and high K capacitor dielectric layer 26 are then subjected to a second annealing at a temperature of less than or equal to about 500° C. in an oxidizing atmosphere. Preferred temperature is from 400° C. to 500° C., with the pressure and time period for anneal being otherwise the same as the first annealing. Example and preferred oxidizing gases include $O_2$, $O_3$, NO, and $N_2O$. Accordingly most preferably, the second annealing is conducted at a lower temperature than the first and can result in filling the oxygen vacancies in the crystalline structure thereby reducing the film leakage.

The above process can significantly reduce oxidation of silicon material, such as material 20, by using an initial higher temperature process which crystallizes and corrects defects in an atmosphere which prevents silicon oxidation. Such is followed by an annealing in an oxidizing atmosphere at lower temperatures which reduces oxygen vacancy and densifies the film, thus reducing leakage and minimizing risk of silicon oxidation. Accordingly and alternately considered, the capacitor dielectric layer is subjected to at least two different temperatures in multiple annealing steps, with the substrate not being exposed to a gaseous oxygen-containing atmosphere at a temperature of greater than about 500° C. between the capacitor dielectric layer formation and formation of a second capacitor electrode. Either of the first or second annealings can be conducted with or without plasma. Plasma might be chosen to enable a lower anneal temperature.

Figure 3:
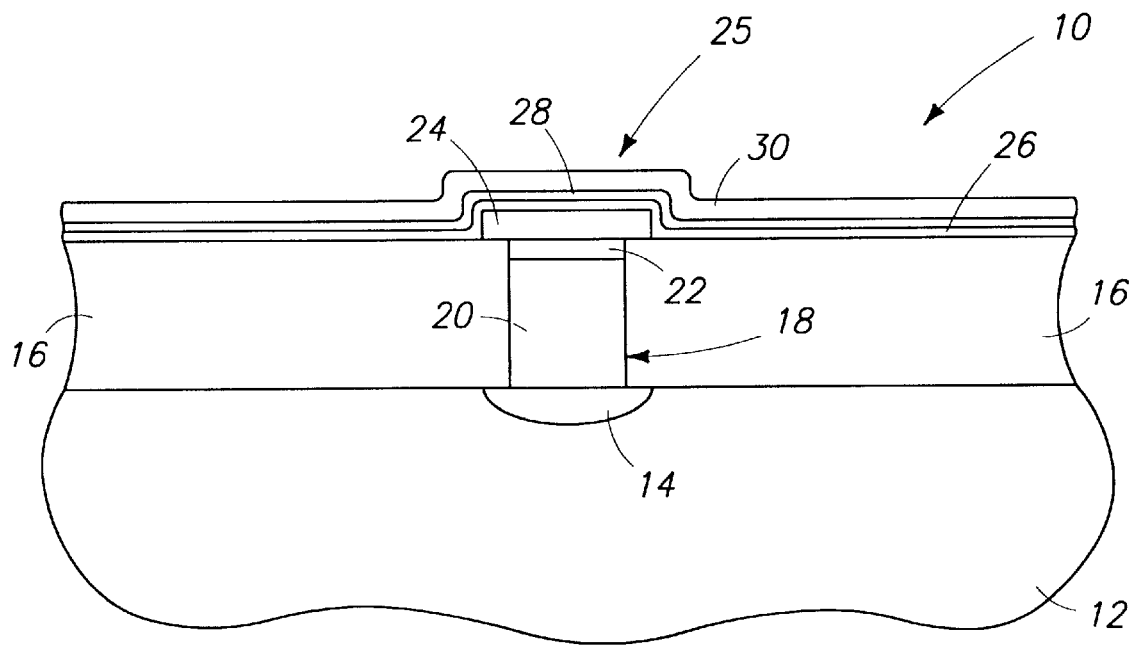
FIG. 3. is a view of the FIG. 1 wafer at a processing step subsequent to that depicted by FIG. 2.
Figure 4:
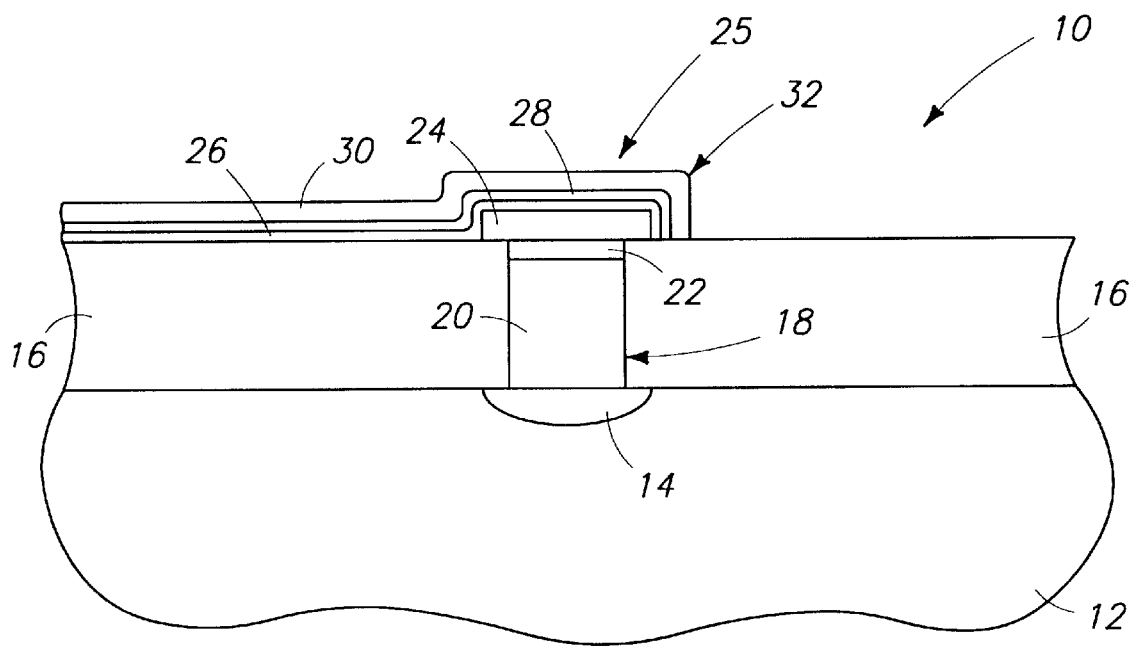
FIG. 4 is a view of the FIG. 1 wafer at a processing step subsequent to that depicted by FIG. 3.

Referring to FIG. 3, a diffusion barrier layer 28 is formed over layer 26, with TiN being an example. A second capacitor electrode layer 30 is formed over layer 28 and accordingly also over high K oxygen capacitor dielectric layer 26. Such is patterned to produce a second capacitor electrode 32 (FIG. 4.) Accordingly in the preferred embodiment, the subject annealings are conducted prior to formation of any portion of second capacitor electrode 32. This will minimize in the illustrated example risk of oxidation of the preferred polysilicon of layer 30 from any out-diffusion of oxygen from the high K capacitor dielectric layer.

The invention was principally motivated from the perspective of capacitor dielectric layer fabrication. The artisan will of course appreciate applicability of the invention with respect to processing of any high K oxygen-containing dielectric layer regardless of whether being formed in a capacitor.

Figure 5:
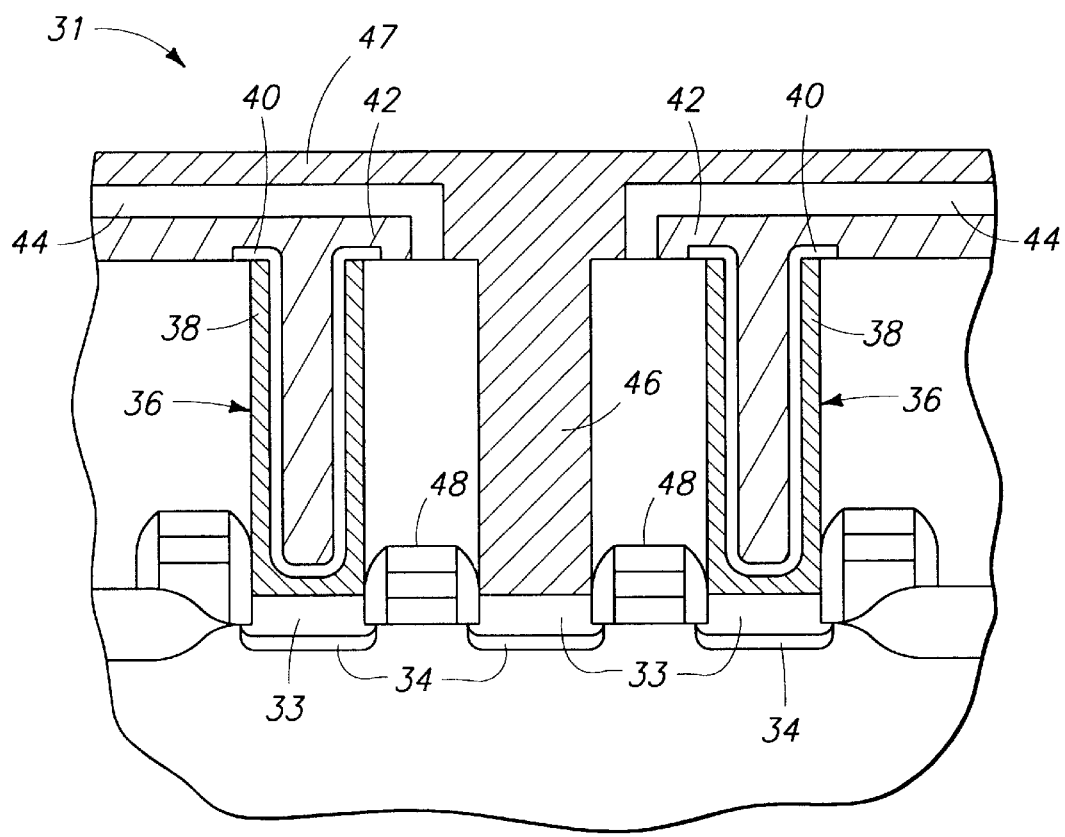
FIG. 5 is a view an alternate embodiment semiconductor wafer fragment in accordance with the invention.

FIG. 5 depicts implementation of the invention in fabrication of DRAM circuitry. A wafer fragment 31 comprises two memory cells, with each comprising a capacitor 36 and a shared bit contact 46. Capacitors 36 electrically connect with substrate diffusion regions 34 through silicide regions 33. For simplicity, capacitors 36 are shown as comprising a first capacitor electrode 38, a capacitor dielectric layer 40, and a second capacitor electrode/cell plate 42. Such can be fabricated of materials described above, preferably to include silicon, barrier layers and a high K oxygen containing capacitor dielectric layer. The high K oxygen containing capacitor dielectric layer is preferably processed as described above. A dielectric layer 44 is formed over second capacitor plate 42. A bit line 47 is fabricated in electrical connection with bit contact 46. Word lines 48 are fabricated to enable selective gating of the capacitors relative to bit contact 46.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A method of forming a capacitor comprising:
   forming a first capacitor electrode over a substrate;
   forming a high K oxygen containing capacitor dielectric layer over the first capacitor electrode;
   first annealing the high K capacitor dielectric layer at a temperature of at least about 500° C. in a substantially non-oxidizing atmosphere;
   after the first annealing, second annealing the high K capacitor dielectric layer at a temperature of less than or equal to about 500° C. in an oxidizing atmosphere; and
   forming a second capacitor electrode over the high K oxygen containing capacitor dielectric layer.

2. The method of claim 1 wherein the first annealing temperature is greater than the second annealing temperature.

3. The method of claim 1 wherein the substrate is not exposed to oxidizing conditions between the forming of the dielectric layer and the first annealing.

4. The method of claim 1 wherein the substantially non-oxidizing atmosphere is substantially inert to chemical reaction with the dielectric layer during the first annealing.

5. The method of claim 1 comprising conducting the second annealing before forming the second capacitor electrode.

6. The method of claim 1 comprising conducting the second annealing after forming at least a portion of the second capacitor electrode.

7. The method of claim 1 comprising providing a conductive diffusion barrier layer intermediate the high K capacitor dielectric layer and first capacitor electrode prior to the first annealing.

8. The method of claim 1 further comprising forming the dielectric layer to be substantially amorphous prior to the first annealing.

9. The method of claim 1 wherein at least one of the first and second annealings is conducted in a plasma environment.

10. The method of claim 1 wherein neither of the first and second annealings is conducted in a plasma environment.

11. The method of claim 1 wherein pressure during both of the first and second annealings is at or below 1 atm.

12. The method of claim 1 wherein the high K dielectric material predominately comprises a pentoxide.

13. The method of claim 1 wherein the high K dielectric material predominately comprises a titanate.

14. The method of claim 1 wherein the first annealing is conducted at a temperature of at least about 600° C.

15. A method of forming a capacitor comprising:
   forming a first capacitor electrode over a substrate;
   forming a high K oxygen containing capacitor dielectric layer over the first capacitor electrode;
   in multiple steps including at least two different temperatures, annealing the capacitor dielectric layer, at least one of the multiple steps comprising annealing at a temperature of at least about 500° C. in a substantially non-oxidizing atmosphere; and
   forming a second capacitor electrode over the high K oxygen containing dielectric layer, the substrate not being exposed to a gaseous oxygen containing atmosphere at a temperature of greater than about 500° C. between the capacitor dielectric layer formation and formation of the second capacitor electrode, the multiple steps being conducted before forming the second capacitor electrode.

16. The method of claim 15 wherein the first annealing temperature is greater than the second annealing temperature.

17. The method of claim 15 wherein the substrate is not exposed to oxidizing conditions between the forming of the dielectric layer and a first of said steps.

18. The method of claim 15 wherein at least one of said multiple steps is conducted in a plasma environment.

19. The method of claim 15 wherein none of said multiple steps is conducted in a plasma environment.

20. The method of claim 15 wherein pressure during all said multiple steps is at or below 1 atm.

21. The method of claim 15 wherein the high K dielectric material predominately comprises a pentoxide.

22. The method of claim 15 wherein the high K dielectric material predominately comprises a titanate.

23. A method of forming a capacitor comprising:
   forming a first capacitor electrode over a substrate;
   forming a conductive diffusion barrier layer over the first capacitor electrode;
   forming a substantially amorphous high K oxygen containing capacitor dielectric layer over the barrier layer;
   first annealing the high K capacitor dielectric layer at a temperature of at least about 500° C. and at a pressure at or below 1 atm in an atmosphere substantially inert to chemical reaction with the dielectric layer, the substrate not being exposed to oxidizing conditions between the forming of the dielectric layer and the first annealing;

after the first annealing, second annealing the high K capacitor dielectric layer at a temperature of less than or equal to about 500° C. and at a pressure at or below 1 atm in an oxidizing atmosphere; and after the second annealing, forming a second capacitor electrode over the high K oxygen containing capacitor dielectric layer.

24. The method of claim 23 wherein the first annealing temperature is greater than the second annealing temperature.

25. The method of claim 23 wherein the first capacitor electrode is configured to at least one of, a) contain silicon, or b) be formed proximately over silicon.

26. The method of claim 23 wherein the high K dielectric material predominately comprises a pentoxide.

27. The method of claim 23 wherein the high K dielectric material predominately comprises a titanate.

28. A method of forming a capacitor comprising:

forming a first capacitor electrode configured to at least one of, a) contain silicon, or b) be formed proximately over silicon;

forming a high K capacitor dielectric layer comprising at least one of a titanate and a pentoxide over the first capacitor electrode;

first annealing the high K capacitor dielectric layer at a temperature of from about 600° C. to 800° C. and at a pressure from about 1 Torr to about 1 atm in an atmosphere substantially inert to chemical reaction with the dielectric layer;

after the first annealing, second annealing the high K capacitor dielectric layer at a temperature of less than or equal to about 500° C. and at a pressure of from about 1 Torr to about 1 atm in an oxidizing atmosphere comprising at least one of a gaseous nitrogen and oxygen containing compound, $O_2$ and $O_3$; and forming a second capacitor electrode over the high K oxygen containing capacitor dielectric layer.

29. The method of claim 28 wherein at least one of the first and second annealings is conducted in a plasma environment.

30. The method of claim 28 wherein neither of the first and second annealings is conducted in a plasma environment.

31. A method of processing a dielectric layer comprising:

forming a high K oxygen containing dielectric layer over a substrate;

first annealing the high K oxygen containing dielectric layer at a temperature of at least about 500° C. in a substantially non-oxidizing atmosphere; and after the first annealing, second annealing the high K oxygen containing dielectric layer at a temperature of less than or equal to about 500° C. in an oxidizing atmosphere.

32. The method of claim 31 wherein the first annealing temperature is greater than the second annealing temperature.

33. The method of claim 31 wherein the first annealing is conducted at a temperature of at least about 600° C.

34. The method of claim 31 wherein the high K dielectric material predominately comprises a pentoxide.

35. The method of claim 31 wherein the high K dielectric material predominately comprises a titanate.

36. The method of claim 31 wherein the substrate is not exposed to oxidizing conditions between the forming of the dielectric layer and the first annealing.

37. The method of claim 31 wherein the substantially non-oxidizing atmosphere is substantially inert to chemical reaction with the dielectric layer during the first annealing.

38. The method of claim 31 wherein at least one of the first and second annealings is conducted in a plasma environment.

39. The method of claim 31 wherein neither of the first and second annealings is conducted in a plasma environment.

40. The method of claim 31 wherein pressure during both of the first and second annealings is at or below 1 atm.

41. A method of forming a DRAM cell comprising:

forming a first capacitor electrode over a substrate;

forming a high K oxygen containing capacitor dielectric layer over the first capacitor electrode;

first annealing the high K capacitor dielectric layer at a temperature of at least about 500° C. in a substantially non-oxidizing atmosphere;

after the first annealing, second annealing the high K capacitor dielectric layer at a temperature of less than or equal to about 500° C. in an oxidizing atmosphere;

forming a second capacitor electrode over the high K oxygen containing capacitor dielectric layer;

providing a field effect transistor having a pair of source/drain regions, one of the source/drain regions being provided in electrical connection with the first capacitor electrode, the other of the source drain regions being provided in electrical connection with a bit line.

* * * * *

UNITED STATES PATENT AND TRADEMARK OFFICE
CERTIFICATE OF CORRECTION

PATENT NO.    : 6,162,744
DATED         : December 19, 2000
INVENTOR(S)   : Husam N. Al-Shareef et al.

It is certified that error appears in the above-identified patent and that said Letters Patent is hereby corrected as shown below:

Title:
Please replace the title with the following -- "Method of Forming High-K Oxygen-Containing Dielectric Layers Including Manufacture of Capacitors and DRAM Cells" --.

Column 4,
Line 37, please delete "annealing" after "Such".

Signed and Sealed this

Fourteenth Day of August, 2001

*Attest:*

NICHOLAS P. GODICI
*Attesting Officer*     Acting Director of the United States Patent and Trademark Office